United States Patent [19]
Hendrickson

[11] 4,081,771
[45] Mar. 28, 1978

[54] 82 DETENT MANUAL VARACTOR TUNING SYSTEM

[75] Inventor: Melvin Carlyle Hendrickson, Elmhurst, Ill.

[73] Assignee: Zenith Radio Corporation, Glenview, Ill.

[21] Appl. No.: 747,580

[22] Filed: Dec. 6, 1976

[51] Int. Cl.² ................... H03J 5/06; H04N 5/52
[52] U.S. Cl. ..................... 334/15; 325/459; 325/465; 358/191
[58] Field of Search ............... 334/15; 325/420–423, 325/453, 459, 464, 465, 468; 358/191, 195

[56] References Cited

U.S. PATENT DOCUMENTS

| | | | |
|---|---|---|---|
| 3,753,172 | 8/1973 | Sakamoto | 334/15 |
| 3,965,427 | 6/1976 | Ma | 334/15 X |

*Primary Examiner*—Paul L. Gensler
*Attorney, Agent, or Firm*—Jack Kail

[57] ABSTRACT

A television tuner system includes a varactor diode as the frequency determining element and means lacking a fine tuning control for addressing the varactor. In the addressing means, a plurality of DC potentials, each defining the band edges of one of the 82 standard broadcast television channels, are selectively accessible for deriving a nominal tuning voltage defining a frequency near the center of a selected channel and a pair of control voltages defining a restricted range of frequencies about the channel center frequency. The nominal tuning voltage is initially supplied to the varactor for tuning to the channel center frequency and is subsequently decoupled therefrom wherein tuning is maintained within the restricted range of frequencies by confining the voltage supplied to the varactor between the pair of control voltages. Automatic frequency control means are used to tune the varactor to a received signal within the restricted range of frequencies.

16 Claims, 1 Drawing Figure

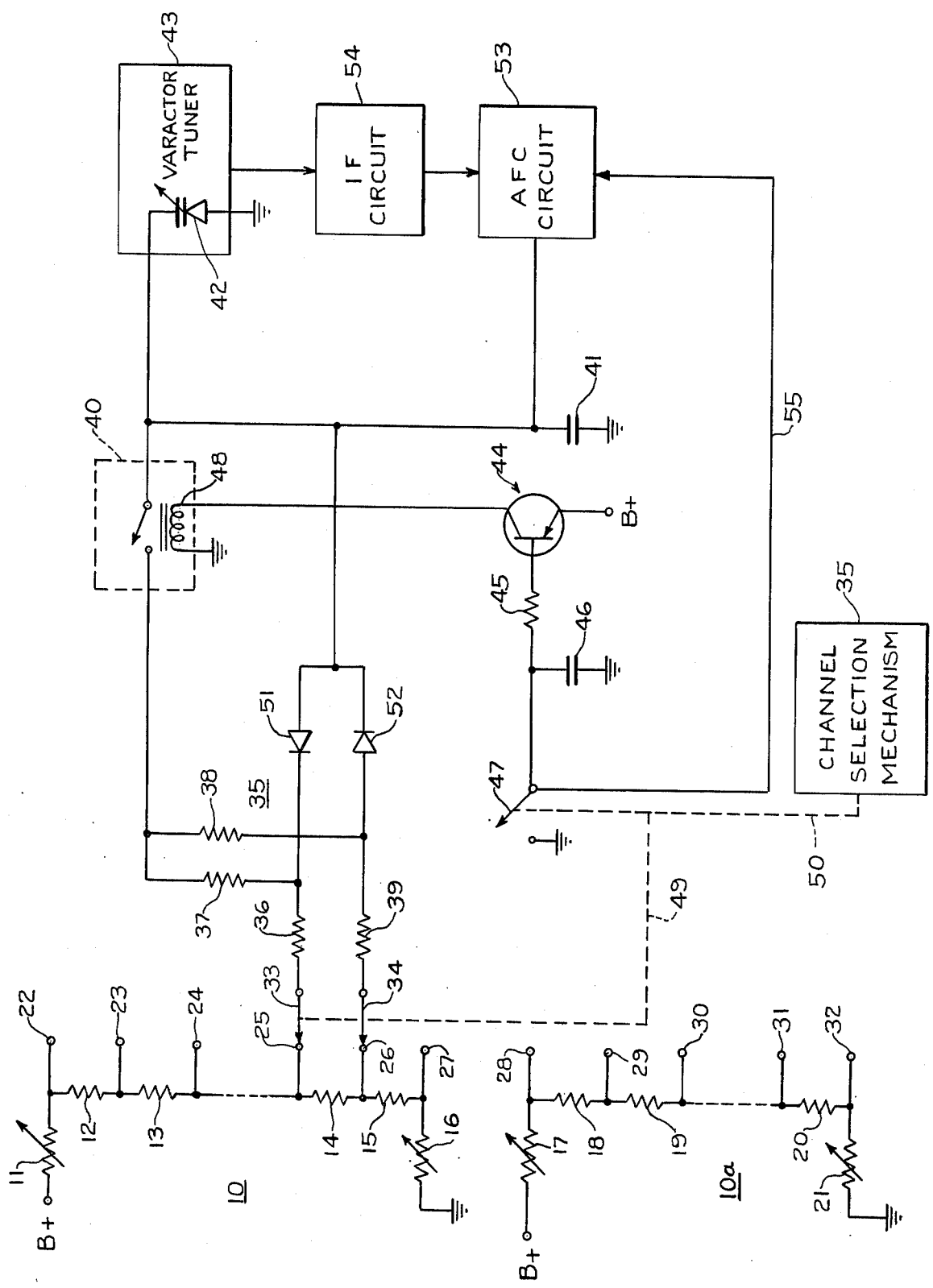

82 DETENT MANUAL VARACTOR TUNING SYSTEM

BACKGRUND OF THE INVENTION

The present invention relates generally to television receiver tuners and, more particularly, to means for addressing a television receiver tuner of the type including a varactor diode as the frequency determining element thereof.

Varactor diodes are finding widespread use as the frequency determining elements in television receiver tuners. Tuning to a desired television channel is conveniently accomplished by impressing a particular DC tuning potential across the varactor which responds thereto by exhibiting, at its output terminals, an appropriate capacitance for tuning to the selected channel. In order to tune to a different channel, the tuning potential applied to the varactor is appropriately varied to effect the necessary change in capacitance. After the channel has been selected, it is general practice to use an automatic frequency control (AFC) circuit to adjust the tuning potential to a received signal within the selected channel. The AFC circuit is normally connected in a feedback loop between the output of the IF stage of the receiver and the tuner input where it generates an error signal for application to the tuner in response to any difference between the frequency of the developed IF signal and that of a reference signal.

The apparatus for developing the tuning potentials for application to the varactors take various forms. Tuning systems using analogical techniques to control the generation of the tuning potentials are exemplified in U.S. Pat. No. 3,906,373, issued Sept. 16, 1975 to Hendrickson and U.S. Pat. No. 3,965,427, issued June 22, 1976 to Ma. In both cases, a manually operable channel selection mechanism is employed to transport appropriate contacts along a resistive voltage divider for developing nominal tuning voltages which are supplied to the varactor. Although the device disclosed in the Hendrickson patent includes a fine tuning control potentiometer in association with its voltage divider, the system disclosed in the Ma reference operates with no such fine tuning control.

However, in either case, i.e. an analog tuning system with or without fine tuning controls, inherent design characteristics pose a situation where system tuning may be lost without hope of recovery except by means of manual retuning. For example, it is possible for the tuning voltage developed across the varactor to exhibit an unintended change sufficient to allow the AFC system to lock onto an adjacent channel carrier. Such may result from an external interferring source or from internal system drift and results in a condition where the signal being received does not correspond to the selected channel. Known prior art analog varactor tuning systems have in themselves no facility for correcting a problem of this sort.

To overcome a similar problem in a digitally controlled varactor tuner, U.S. Pat. No. 3,961,266, issued June 1, 1976 to Tanaka, discloses the use of a "window" tuner address system. In this disclosure, the tuner address system includes means for developing a driving ramp voltage for application to the tuning varactors in response to the comparison between encoded representations of the local oscillator frequency and the selected channel number until the tuning voltage achieves a value falling within a predetermined range of voltages defining a frequency "window" about the desired carrier signal. Tuning is confined to the "window" as the result of an intentionally generated counting ambiguity which effectively eliminates the problems of adjacent channel interference as described above. Within the frequency "window", an AFC circuit is operative for locking the local oscillator frequency onto the picture IF carrier. It will be appreciated, however, that while the foregoing digital "window" varactor tuner address system provides adequate performance, it is relatively complex in design and structure and, accordingly, rather difficult and expensive to manufacture. In fact, for the low-cost television receiver market, the manufacturing expenses associated therewith are substantially prohibitive.

Another advantage associated with the use of the "window" tuning system described in the aforementioned Tanaka patent is its adaptability for use in combination with a "non-proportionate" AFC circuit such as that disclosed in U.S. Pat. No. 3,980,968, issued Sept. 14, 1976 to Ma. Conventional varactor tuning systems of the analog variety include gain limited AFC loops which are characterized by a so-called static frequency error preventing exact tuning of the local oscillator to the received signal. In a "non-proportionate" AFC system, the tuning voltage is adjusted by supplying increments of charge to a tuning capacitor, which has previously been "coarse" tuned to a particular DC level, in lieu of directly summating the AFC error voltage with the tuning voltage in the conventional manner. Through this approach, while the finite tuning capacitor charging time affects AFC acquisition speed, it is possible, within component activation voltage limits, to reduce the static frequency error to substantially zero by establishing a precise tuning relationship between the local oscillator frequency and the received signal.

However, it is not believed that a "non-proportionate" AFC system has ever been successfully incorporated in an analog television receiver tuner and particularly in a simple and inexpensively manufactured tuner of the type using a resistive voltage divider for generating tuning potentials.

SUMMARY OF THE INVENTION

It is accordingly an object of the present invention to provide an improved television tuning system characterized by a simple construction and which may be manufactured relatively inexpensively.

Another object of the present invention is to provide novel means for addressing a varactor diode televsion receiver tuner from a tuning voltage source comprising at least one voltage divider.

In accordance with these and other objects the tuning system of the present invention includes means, such as a resistive voltage divider, for establishing a plurality of tuning potentials for application to a varactor diode television receiver tuner. An addressing circuit is interposed between the tuning voltage generating means and the varactor tuner and comprises a control voltage divider selectively connectable across each of the plurality of DC potentials by a channel selection mechanism. The control voltage divider is configured for deriving, from each tuning potential, a nominal tuning voltage defining a frequency near the center of a selected channel and a pair of related control voltages defining a restricted range of frequencies, i.e. a frequency window, within the selected channel and about the center frequency.

For a relatively short period following channel selection intervals, switching means supply the nominal tuning voltage to a tuning capacitor connected across the varactor for initially or coarse tuning to the center frequency. Subsequently, the switching means decouples the control voltage divider from the tuning capacitor and means are connected for confining the voltage across the tuning capacitor between the pair of control voltages to maintain tuning within the restricted range of frequencies. Concurrently, an AFC circuit, connected in a feedback loop between the receiver's IF stage and the tuning capacitor, is operated for adjusting the voltage developed across the tuning capacitor for tuning to a received signal within the restricted frequency range. Since the feedback loop is decoupled from the addressing circuit after initial tuning, the AFC system may be of the "non-proportionate" variety.

DESCRIPTION OF THE PREFERRED EMBODIMENTS

The single drawing depicts in combined block and schematic form a television tuning system incorporating the present invention. Referring to the drawing, a UHF tuning voltage divider is shown at 10 and a similar VHF tuning voltage divider is shown at 10a. UHF voltage divider 10 comprises a series connected succession of resistors 11–16 connected between a source of DC potential and ground, VHF voltage divider 10a comprising a similarly connected succession of resistors 17–21 also connected between a source of DC potential and ground. A plurality of stationary contacts 22–32 are disposed at the junctions formed between the various resistors 11–21, any adjacent pair of stationary contacts 22–32 exhibiting the DC potential associated with one of the resistors 11–21. Component values for UHF voltage divider 10 and VHF divider 10a are selected such that the DC potentials appearing across the various resistors 12–20 individually define the band edges of the standard television broadcast channels. For example, the potential developed across UHF resistor 13 and appearing at stationary contacts 23 and 24 may define, in terms of frequency, the band edges of channel 16, the DC potential developed across VHF resistor 19 and appearing at stationary contacts 29 and 30 channel 3 and so on. The dashed lines joining stationary contacts 24 and 25 as well as stationary contacts 30 and 31 indicate the existence of additional and similarly arranged stationary contacts and voltage divider resistors to account for the entire spectrum of television channels. In this regard, yet further voltage divider resistors may be included to accommodate the discontinuities in the various television bands. Finally, resistors 11, 16 and 17, 21 may be made variable to facilitate proper proportioning of the voltage dividers 10 and 10a.

A pair of movable contacts 33 and 34, operable by a channel selection mechanism 35, are transportable relative to stationary contact 22–32 for selectively connecting a control voltage divider 35 across the potential difference associated with any one of the voltage divider resistors 12–20. Control voltage divider 35, which comprises the series connection of resistors 36–39, is proportioned to develop, at the junction formed between resistors 37 and 38, a nominal tuning voltage defining a frequency near the center of the selected television channel. Control voltage divider 35 is further adapted to develop a pair of control voltages at the junctions formed between resistors 36 and 37 and resistors 38 and 39 defining a restricted range of frequencies, i.e. a frequency window, within the selected channel and about the center frequency corresponding to the nominal tuning voltage. To this end, it will be recognized that the voltage developed at the junction between resistors 36 and 37 will be somewhat larger than the nominal tuning voltage developed at the junction formed between resistors 37 and 38 whereas the remaining control voltage developed at the junction formed between resistors 38 and 39 will be somewhat smaller than the nominal tuning voltage. In practice, the control voltages will define a frequency range or window of approximately 2 megahertz for VHF channels and approximately 6 megahertz for UHF channels.

The nominal tuning voltage developed by control voltage divider 35 is selectively applied through a reed relay 40 to a tuning capacitor 41 and therefrom to a varactor tuning element 42 of a varactor tuner 43. Then, when reed relay 40 is closed, tuning capacitor 41 will cause tuner 43 to tune to the center frequency of the selected channel corresponding to the nominal tuning voltage. When opened, reed relay 40 decouples the nominal tuning voltage developed at the junction between resistors 37 and 38 from tuning capacitor 41 and varactor tuner 43.

The state of reed relay 40 is controlled by the collector current of a switching transistor 44 whose conduction is in turn controlled by channel selection mechanism 35. The base terminal of transistor 44 is connected through a resistor 45 and a capacitor 46 to an AFC defeat switch 47 while its emitter terminal is connected to B+ potential and its collector terminal is connected to an energizing coil 48 of relay 40. As indicated by dashed lines 49 and 50, AFC defeat switch 47 and movable contacts 33 and 34 are ganged together and simultaneously operable by channel selection mechanism 35. Therefore, during operation of channel selection mechanism 35 to transport movable contacts 33 and 34 from one set of the voltage divider stationary contacts to another set, referred to hereinafter as a channel selection interval, AFC defeat switch 47 is grounded causing transistor 44 to conduct. The resulting collector current energizes coil 48 causing relay 40 to close connecting the junction between resistors 37 and 38 to tuning capacitor 41. Following the channel selection interval AFC defeat switch 47 opens and transistor 44 remains conductive for a short period until capacitor 46 charges to B+ potential and during which period the nominal tuning voltage is supplied to capacitor 41. Subsequently, transistor 44 cuts off de-energizing relay 40 and decoupling the nominal tuning voltage from tuning capacitor 41.

The control voltages developed at the junctions between resistors 36 and 37 and resistors 38 and 39 are coupled to tuning capacitor 41 by a pair of diodes 51 and 52. Diode 51 has its cathode connected to the junction between resistors 36 and 37 and its anode connected to tuning capacitor 41 whereas the cathode of diode 52 is connected to tuning capacitor 41 and its anode is connected to the junction between resistors 38 and 39. An AFC circuit 53 is connected in a feedback loop including tuner 43 and an IF circuit 54 for supplying tuning capacitor 41. In addition, AFC circuit 53 receives an input along a line 55 from AFC defeat switch 47. AFC circuit 53 preferably comprises a nonporportionate type system as fully described in the previously mentioned Ma patent, U.S. Pat. No. 3,980,968.

As already described, during a channel selection interval, i.e. during the operation of channel selection mechanism 35 to displace movable contacts 33 and 34 relative to stationary contacts 22-32, AFC defeat switch 47 is grounded disabling AFC circuit 53 and discharging capacitor 46. Discharging of capacitor 46 causes transistor 44 to conduct and its collector current energizes coil 48 operating reed relay 40 for connecting the junction between resistors 37 and 38 to tuning capacitor 41. After the channel has been selected, AFC defeat switch 47 is opened enabling AFC circuit 53 and allowing capacitor 46 to charge toward the emitter potential of transistor 44. After a relatively short period, determined by the time constant of resistor 45 and capacitor 46, transistor 44 will cease conducting opening reed relay 40 and decoupling the junction between resistors 37 and 38 from tuning capacitor 41. However, during this short period, typically approximately 100 milliseconds, the nominal tuning voltage developed at the junction between resistors 37 and 38 is applied to tuning capacitor 41 for causing varactor tuner 43 to tune to a frequency near the center of the selected television channel.

Moreover, after the channel selection has been completed diodes 51 and 52 are connected between tuning capacitor 41 and the control voltages developed at the junctions between resistors 36 and 37 and resistors 38 and 39. Due to the limited pull-in and hold-in range of AFC circuit 53, typically on the order of 1-2 megahertz, as well as the possibility of unintended voltage excursions across tuning capacitor 41, diodes 51 and 52, in association with control voltage divider 35, are effective for establishing a frequency window about the channel center frequency by confining the tuning voltage developed across capacitor 41 within a range defined by the control voltages developed at the junctions between resistors 36 and 37 and resistors 38 and 39. Thus, since the control voltage developed at the cathode of diode 51 is normally greater than the nominal tuning voltage and the control voltage developed at the anode of diode 52 is normally less than the nominal tuning voltage, both of the diodes will normally by nonconductive. But, in response to the voltage across tuning capacitor 41 increasing to or above the control voltage developed at the junction between resistors 36 and 37, diode 51 becomes conductive for limiting the increase to the level of the control voltage. Similarly, in response to the voltage developed across tuning capacitor 41 dropping to or below the control voltage developed at the junction between resistors 38 and 39, diode 52 becomes conductive limiting the decrease to the level of the control voltage.

Furthermore, since reed relay 40 is opened shortly after the completion of the channel selection, the AFC loop including tuner 43, IF circuit 54, AFC circuit 53 and tuning capacitor 41 is completely decoupled from the tuning voltage generating circuits. In this decoupled environment, "non-proportionate" AFC circuit 53 is operative for supplying or removing charge from tuning capacitor 41 allowing the system to lock to a received signal. Because control voltage divider 35 is decoupled from the AFC loop there will be substantially no leakage of charge from capacitor 41 which is therefore effective for precisely controlling tuner 43. It will be recalled that such allows for operation of the AFC loop with substantially no static frequency error.

What has been shown is a novel system for addressing a varactor tuner from a tuning voltage generating means comprising a selectively accessible resistive voltage divider. Means for developing a frequency window are provided to facilitate operation and to prevent locking to an adjacent channel carrier. The system permits precise tuning without a fine tuning control by decoupling the tuning voltage generating means from the AFC loop, which is operative in a non-proportionate mode to substantially eliminate any static frequency error.

While a particular embodiment of the present invention has been shown and described, it will be obvious to those skilled in the art that various changes and modifications may be made without departing from the invention in its broader aspects. The aim of the appended claims, therefore, is to cover all such charges and modifications as fall within the true spirit and scope of the invention.

What is claimed is:

1. A television receiver tuner comprising:
   tuning means including at least one varactor as the frequency determining element thereof;
   means simultaneously developing a plurality of nominal tuning voltages for selective application to said varactor for tuning a desired television channel;
   means for decoupling said tuning voltage developing means from said varactor while confining the voltage applied thereto to a range of voltages including the nominal tuning voltage corresponding to said desired channel, said range of voltages defining a restricted range of frequencies within said desired television channel; and
   automatic frequency control means operable for adjusting the voltage applied to said varactor for tuning to a received signal within said restricted range of frequencies.

2. The tuner according to claim 1 including channel selection means operable for selecting one of said plurality of nominal tuning voltages for application to said varactor and means in association therewith for disabling said automatic frequency control means substantially during channel selection intervals, said means for decoupling and confining being operative subsequent to a channel selection interval.

3. The tuner according to claim 2 wherein said automatic frequency control means comprises a non-proportionate automatic frequency control circuit.

4. In a television receiver tuner of the type having resistive means developing a nominal tuning voltage for supplying a capacitive network connected for tuning a varactor element to a selected television channel, the improvement comprising:
   switching means initially connecting said resistive means to said capacitive network for supplying said nominal tuning voltage and subsequently decoupling said resistive means from said capacitive network;
   automatic frequency control means in association with said capacitive network and operable for adjusting the voltage thereacross for tuning said varactor element to a received signal in said selected television channel; and
   control means operable for confining the voltage impressed across said capacitive network to a range of voltages including said nominal tuning voltage, said voltage range defining a restricted range of frequencies within said television channel.

5. The improvement according to claim 4 wherein said control means includes second switching means connected to said capacitive network, said second switching means being maintained in an off condition whenever the voltage across said capacitive network is substantially within said voltage range.

6. The improvement according to claim 5 including channel selection means having means for developing an automatic frequency control defeat signal during channel selection intervals, said switching means being operable for connecting substantially during the presence of said defeat signal and for a relatively short period thereafter.

7. The improvement according to claim 6 wherein said automatic frequency control means is operative in response to the absence of said defeat signal and wherein said control means is operative substantially concurrently therewith.

8. The improvement according to claim 7 wherein said automatic frequency control means comprises a non-proportionate automatic frequency control circuit.

9. A television receiver tuner comprising:
tuning means including at least one varactor diode as the frequency determining element, the frequency determined being a function of the voltage presented to a terminal of said varactor;
a voltage generating element connected for presenting a voltage to said terminal;
means for establishing a plurality of DC potentials each defining a frequency range corresponding to a television channel;
a control voltage divider selectively connectable across each of said plurality of DC potentials for deriving therefrom a nominal tuning voltage defining a frequency near the center of a selected channel and a pair of control voltages defining a restricted range of frequencies within said selected channel and about said center frequency;
means initially supplying said nominal tuning voltage from said control voltage divider to said voltage generating element for tuning to said center frequency and subsequently decoupling said control voltage divider from said voltage generating element;
means for confining the voltage developed by said voltage generating element between said pair of control voltages for maintaining tuning within said restricted range of frequencies; and
automatic frequency control means for adjusting the voltage developed by said voltage generating element for tuning to a received signal within said restricted frequency range.

10. The television tuner according to claim 9 including channel selection means operable for selectively connecting said control voltage divider across a desired one of said plurality of DC potentials.

11. The television tuner according to claim 10 including means ganged with said channel selection means for disabling said automatic frequency control means substantially during channel selection intervals.

12. The television tuner according to claim 11 wherein said means for initially supplying said nominal tuning voltage comprises first switching means operable in response to said means for disabling for supplying said nominal tuning voltage to said terminal for a relatively short period following operation of said channel selection means.

13. The television tuner according to claim 12 wherein said means for confining comprises second switching means connected for confining the voltage developed by said voltage generating element between said pair of control voltages following operation of said channel selection means.

14. The television tuner according to claim 13 wherein said voltage generating element comprises a capacitive network interposed between said terminal and said automatic frequency control means, said first switching means and said second switching means and wherein said means for establishing said plurality of DC potentials comprises;
a source of DC potential; and
a voltage divider connected across said source of potential and comprising a plurality of resistors, the voltages across at least some of which comprise said plurality of DC potentials.

15. The television tuner according to claim 14 wherein said second switching means comprises a first switching device operable for discharging said capacitive network in response to the voltage developed across said capacitive network exceeding the greater of said pair of control voltages and a second switching device for charging said capacitive network from said source of DC potential in response to the voltage developed across said capacitive network falling below the other of said pair of control voltages.

16. The television tuner according to claim 15 wherein said automatic frequency control means comprises a non-proportionate automatic frequency control circuit.

* * * * *